(12) United States Patent
Sokolov

(10) Patent No.: US 11,974,399 B2
(45) Date of Patent: Apr. 30, 2024

(54) METHOD OF MANUFACTURING A THREE-DIMENSIONAL ELECTRONIC MODULE HAVING HIGH COMPONENT DENSITY, AND DEVICE

(71) Applicant: Yuriy Borisovich Sokolov, Fryazino (RU)

(72) Inventor: Yuriy Borisovich Sokolov, Fryazino (RU)

( * ) Notice: Subject to any disclaimer, the term of this patent is extended or adjusted under 35 U.S.C. 154(b) by 534 days.

(21) Appl. No.: 17/261,547

(22) PCT Filed: Mar. 4, 2019

(86) PCT No.: PCT/RU2019/000141
§ 371 (c)(1),
(2) Date: Jan. 19, 2021

(87) PCT Pub. No.: WO2019/245402
PCT Pub. Date: Dec. 26, 2019

(65) Prior Publication Data
US 2023/0143909 A1 May 11, 2023

(30) Foreign Application Priority Data
Jun. 18, 2018 (RU) .......................... RU2018122096

(51) Int. Cl.
*H05K 1/18* (2006.01)
*H05K 1/02* (2006.01)
(Continued)

(52) U.S. Cl.
CPC ........... *H05K 1/189* (2013.01); *H05K 1/0278* (2013.01); *H05K 1/05* (2013.01); *H05K 3/303* (2013.01);
(Continued)

(58) Field of Classification Search
CPC ........ H05K 1/189; H05K 1/0278; H05K 1/05; H05K 3/303; H05K 3/306;
(Continued)

(56) References Cited

U.S. PATENT DOCUMENTS 2,816,253 A * 12/1957 Blitz ..................... H05K 1/144
  361/736
4,085,433 A * 4/1978 Baranowski ........... H05K 1/189
  361/744
(Continued)

FOREIGN PATENT DOCUMENTS

CN 102595788 A 7/2012
CN 103730446 A 4/2014
(Continued)

OTHER PUBLICATIONS

WO-2009043649-A2—English Translation (Year: 2009).*

*Primary Examiner* — Anatoly Vortman
(74) *Attorney, Agent, or Firm* — Bryant J. Keller; Kirton McConkie

(57) ABSTRACT

Systems and methods of providing a three-dimensional electronic module having high component density are disclosed. In some cases, the module has improved heat dissipation, reduced weight and size, and increased protection against electromagnetic radiation. In some cases, the module includes a printed circuit board configured to be folded into a convex polyhedron, with the polyhedron's faces formed by sections of the printed circuit board. In some cases, the electronic components face the interior of the circuit board and fall into gaps between the components installed on the other sections.

20 Claims, 4 Drawing Sheets

(51) Int. Cl.
  *H05K 1/05* (2006.01)
  *H05K 3/30* (2006.01)
(52) U.S. Cl.
  CPC ... *H05K 3/306* (2013.01); *H05K 2201/09027* (2013.01); *H05K 2201/0999* (2013.01); *H05K 2201/10189* (2013.01)
(58) Field of Classification Search
  CPC . H05K 2201/09027; H05K 2201/0999; H05K 2201/10189
  USPC .......................................................... 361/707
  See application file for complete search history.

(56) References Cited

U.S. PATENT DOCUMENTS

| | | | | |
|---|---|---|---|---|
| 4,513,064 | A * | 4/1985 | Marcus | H05K 7/14 D13/184 |
| 4,677,252 | A * | 6/1987 | Takahashi | H05K 1/056 361/779 |
| 4,742,183 | A * | 5/1988 | Soloway | H05K 1/148 174/254 |
| 5,031,027 | A * | 7/1991 | Dorinski | H05K 1/189 257/660 |
| 5,224,023 | A * | 6/1993 | Smith | G06F 1/184 174/254 |
| 5,257,718 | A * | 11/1993 | Chiu | H05K 3/0014 29/830 |
| 6,154,367 | A * | 11/2000 | Pavlovic | H05K 7/20509 361/720 |
| 6,292,370 | B1 * | 9/2001 | Anderson | H05K 3/0014 361/752 |
| 6,501,661 | B1 * | 12/2002 | Moore | H05K 1/189 361/752 |
| 7,005,584 | B2 * | 2/2006 | Levi | H05K 1/14 174/254 |
| 2005/0180120 | A1 * | 8/2005 | Levi | H05K 1/14 361/752 |
| 2005/0184376 | A1 * | 8/2005 | Salmon | H01L 23/5386 257/E21.526 |
| 2005/0270750 | A1 | 12/2005 | Sarno et al. | |
| 2009/0040736 | A1 * | 2/2009 | Becherer | H05K 1/14 361/749 |
| 2016/0174378 | A1 * | 6/2016 | Johnson | H05K 1/148 29/830 |

FOREIGN PATENT DOCUMENTS

| | | | |
|---|---|---|---|
| JP | 2016-162939 A | 9/2016 | |
| RU | 2299497 C2 | 5/2007 | |
| RU | 2364006 C1 | 8/2009 | |
| WO | WO-2009043649 A2 * | 4/2009 | ............... H05K 1/14 |

* cited by examiner

METHOD OF MANUFACTURING A THREE-DIMENSIONAL ELECTRONIC MODULE HAVING HIGH COMPONENT DENSITY, AND DEVICE

FIELD

The present disclosure relates to the technical area of manufacturing electronic devices fitted with surface-mount components. The disclosed systems and methods can be applied in avionics, telecommunications, lighting engineering, and other fields, and can be configured for use in a power source, a converter, a sensor, or another kind of electronic device.

BACKGROUND

Methods of assembling electronic components are known. For example, electronic components might include a light-emitting three-dimensional electronics package that has electronic components installed on a planar metal board. Some techniques may exist for providing a planar board installed on a heat sink with a hemispherical shape, or a planar board folded into a three-dimensional spherical unit with the latter fixed on the heat sink surface (see CN 102595788, H01L33/64, published on 18 Jul. 2012). That said, known techniques such as those discussed above may not be suitable for creating a protected, universal, three-dimensional, electronic unit as described herein.

Other methods may include surface mount components installed on eight-layer board sections with four-layer flexible sections of the board folded so that surface-mount components occur between eight-layer sections of the board, thus forming a three-dimensional U-shaped structure of a stiff-plastic printed-circuit board (see CN103730446, H01L21/56, published on 16 Apr. 2014). Unfortunately, such methods suffer from the drawbacks of limited applicability due to the lack of various components, such as surface mount technology (SMT) elements, through-hole elements, and a rigid base.

Other methods may include a protected three dimensional electronic unit comprising a stack of printed-circuit boards, on each of which a group of single-type electronic components is preliminary installed. In some such cases, each of the printed-circuit boards is fixed to its rigid frame made of heat-conductive material. In some cases, components on every board are installed in a chamber between adjacent boards (see US2005270750, H05K 7/20, published on 8 Dec. 2005). Some disadvantages of the above are that it is difficult to extract heat out of closed cavities of such a three-dimensional unit, there are often no means to select configuration of the unit, and it may not be possible to use through-hole elements in connection with such a configuration.

Thus, while techniques currently exist that are used to create electronic components, challenges still exist, including those listed above. Accordingly, it would be an improvement in the art to augment or even replace current techniques with other techniques.

SUMMARY

The systems and methods described herein include a three-dimensional electronic module having high component density, such as a foldable printed circuit board with particular component arrangements. A technical result of the disclosed systems and methods is improved weight-and-size characteristics of a finished electronic item owing to more compact arrangement of components; better dissipation of heat from components; and more intensive electromagnetic shielding behavior.

BRIEF DESCRIPTION OF THE DRAWINGS

The objects and features of the present disclosure will become more fully apparent from the following description and appended claims, taken in conjunction with the accompanying drawings. Understanding that these drawings depict only typical embodiments of the disclosed systems and methods and are, therefore, not to be considered limiting of its scope, the systems and methods will be described and explained with additional specificity and detail through the use of the accompanying drawings in which:

DETAILED DESCRIPTION

A description of embodiments will now be given with reference to the Figures. It is expected that the present systems and methods may take many other forms and shapes, hence the following disclosure is intended to be illustrative and not limiting, and the scope of the disclosure should be determined by reference to the appended claims.

As shown in FIGS. 1-4, some embodiments of the systems and methods include a method of manufacturing a three dimensional electronics module with compactly accommodated components. Some embodiments include manufacturing a printed circuit board 1. In some embodiments, the printed circuit board includes a metal base configured to operate as a heat sink.

Some embodiments of the method include installing electronic components (e.g., surface mount components 9 and other electronic components 10) on the surface of the printed circuit board.

Figure 1:
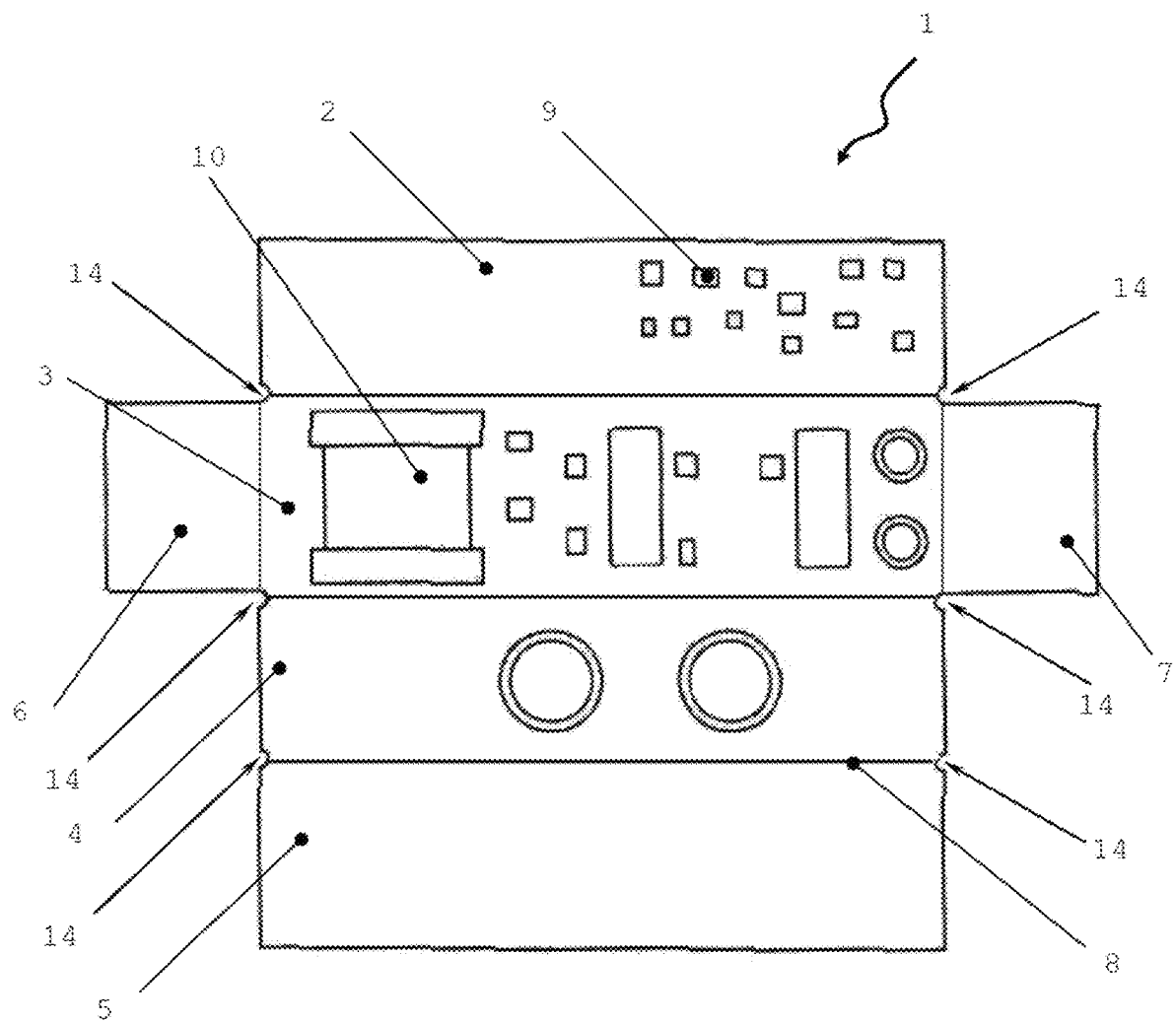
FIG. 1 shows a plan view of a fold-up printed circuit board in an unfolded configuration, in accordance with some embodiments.
Figure 2:
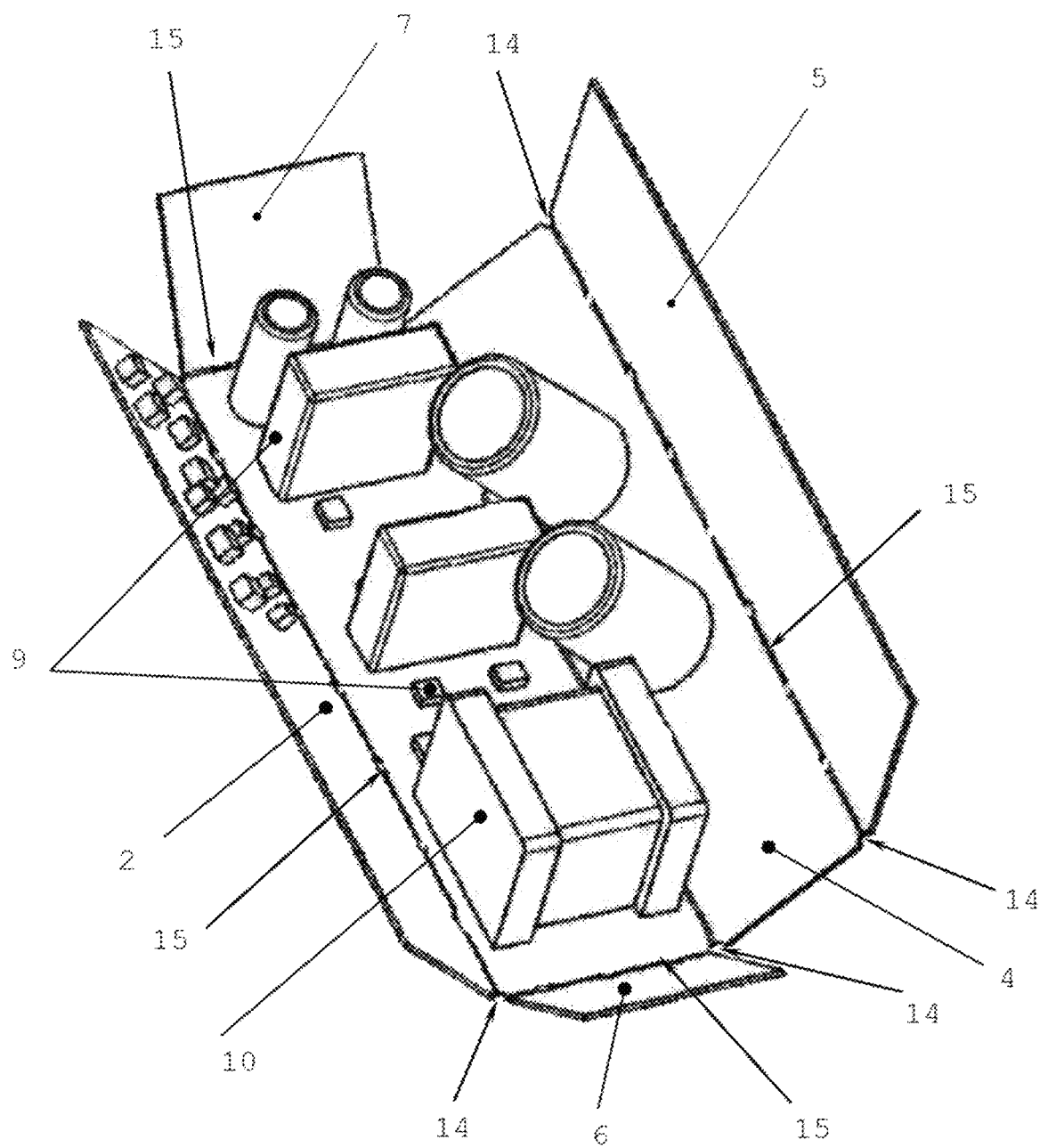
FIG. 2 shows a perspective view of the fold-up printed circuit board in an intermediate folding configuration, in accordance with some embodiments.
Figure 3:
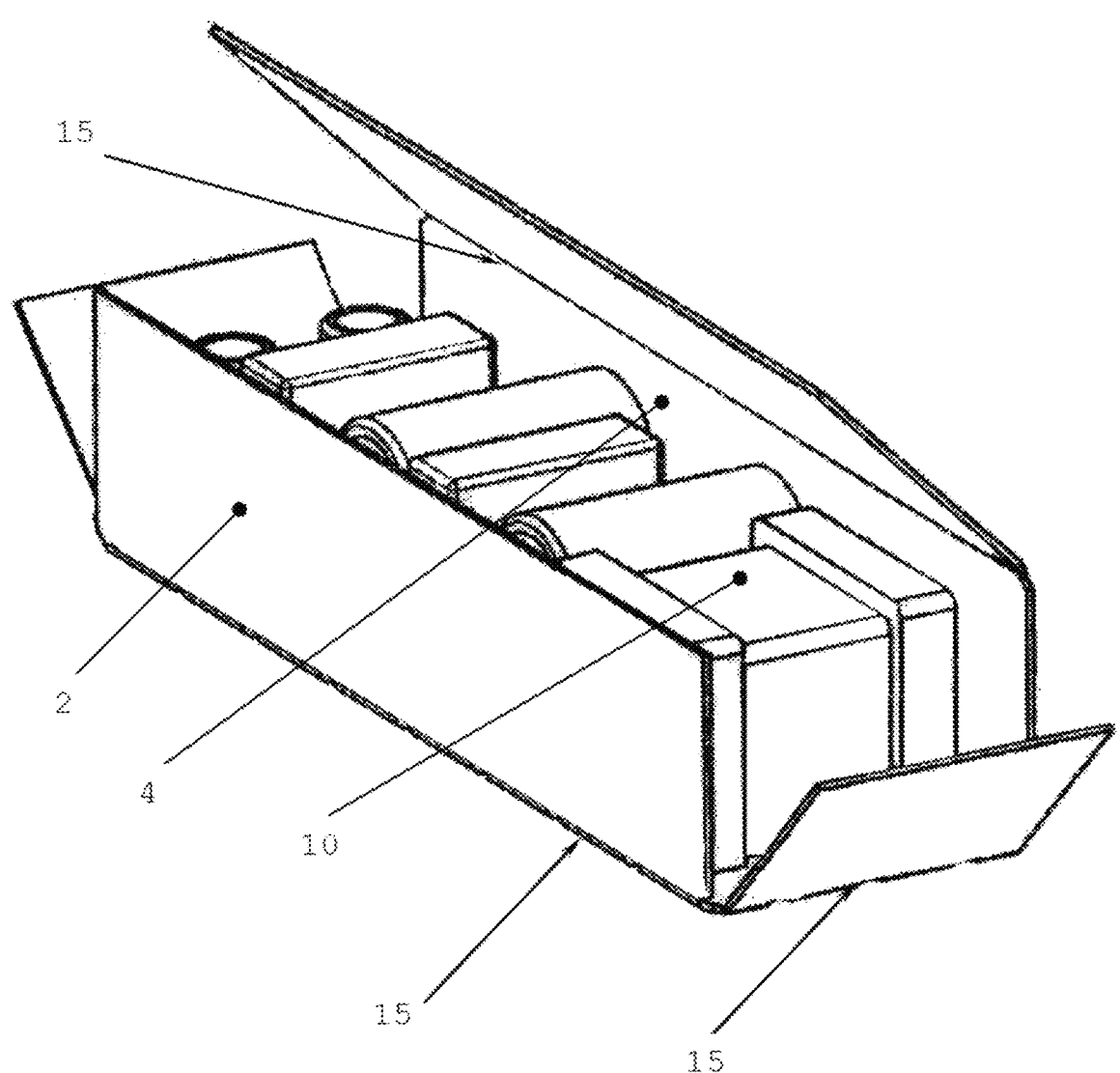
FIG. 3 shows a perspective view of the fold-up printed circuit board in an advanced folding configuration, in accordance with some embodiments.
Figure 4:
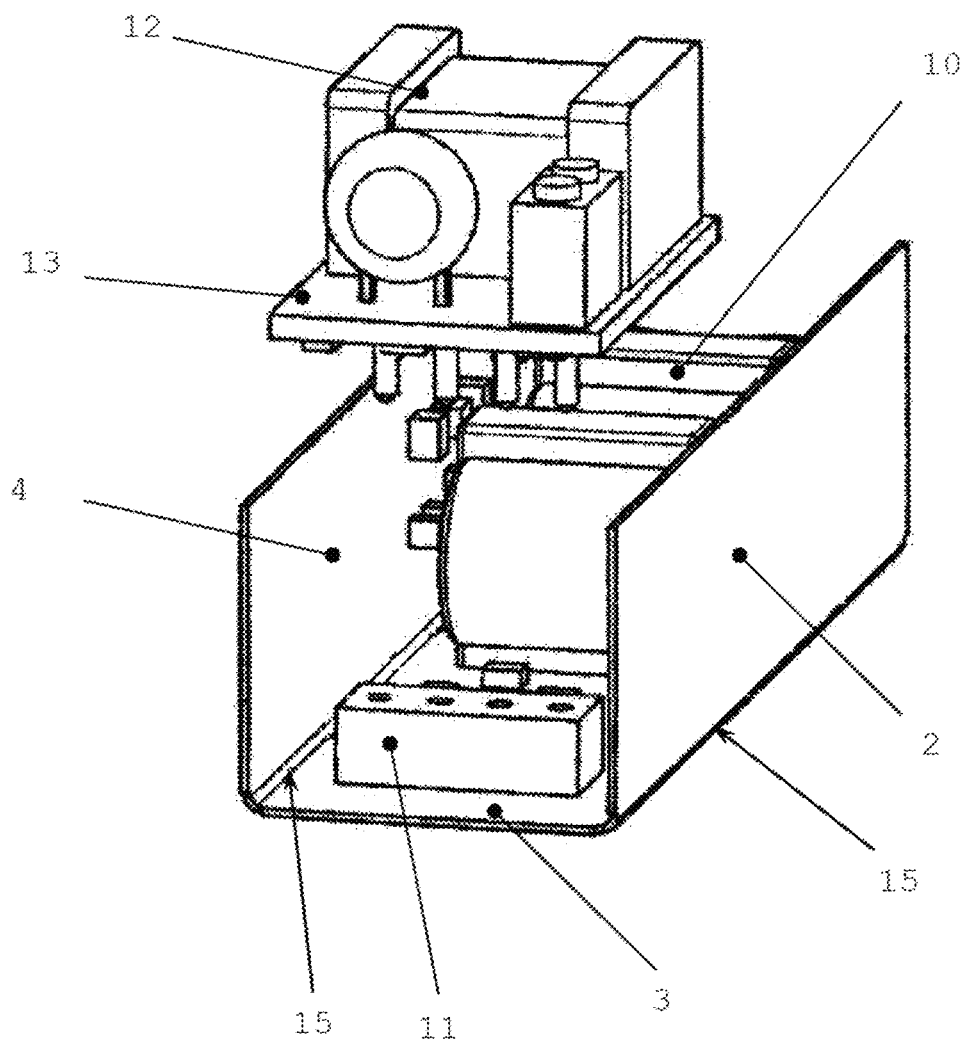
FIG. 4. shows a perspective view of an alternative fold-up printed circuit board, in accordance with some embodiments.

In some embodiments, the method includes folding the printed circuit board 1. In this regard, some embodiments of the printed circuit board include one or more folding portions or sections 2, 3, 4, 5, 6, and 7. In some cases, the printed circuit board has an initial substantially planar configuration (as shown in FIG. 1), but the folding portions are configured to fold away from the planar configuration to form a three-dimensional configuration (as shown in FIGS. 2-4). In some cases, folding the folding portions results in the printed circuit board adopting a polyhedron configuration, with the folding portions forming the faces of the polyhedron.

Some embodiments of the method include delineating the folding portions by marking them with bend lines 8 (e.g., any line that provides guidance on where and how to fold the printed circuit board, or that makes such folding easier).

In some embodiments, the installing electronic components on the surface of the printed circuit board 1 includes installing electronic components on the respective surfaces of at least two sections (e.g., folding portions or non-folding portions) of the printed circuit board.

In some embodiments, folding the printed circuit board 1 includes folding the folding portions at the bend lines 8 until an electronic component of one section is brought into a free space between electronic components of another section (or of several other sections) of the printed circuit board.

In some embodiments, marking the printed circuit board 1 with bend lines 8 includes forming a technological pattern of bend lines laid out between sections of the board, along which bending will be made (in some cases, the bending is carried out using a specialized fixture or device, so in some cases, the bend lines are configured to facilitate the device's bending of the base). In some cases, the technological pattern can be designed to form a number of round reliefs 14 (or blind holes) that designate end points of the bend lines in order to relieve plastic deformation of the fold-up printed circuit board.

In some embodiments, the sections 2, 3, 4, 5, 6, and 7 of the printed circuit board 1, when folded, are configured to become faces of a spatial structure such as a polyhedron (including a cube, a parallelepiped, a prism structure, a truncated pyramid, or another spatial (open or closed) cavity structure). In some cases, the spatial structure of the printed circuit board has N number of faces, where N is a natural number greater than or equal to 3. The particular spatial structure and its fold-up shape may be modified to solve particular problems, as may be necessary in connection with certain electronic devices.

In some embodiments, the layout of components (e.g., electronic components) on the printed circuit board's sections may also be determined or modified throughout the engineering stage, with due reference to the desired shape of the folded unit, and taking into account specific schematic and heating engineering features, as well as technological unit shaping features.

In some embodiments, surface-mount components, output components, and electronic components are installed on the fold-up printed circuit board, such that they are grouped on the respective surfaces of at least two sections of the printed circuit board, in such a way that during folding, the spatial volume of the components themselves will be kept unchanged while the dimensions of the spatial volume between components and units will change. As a result, electronic components of one section of the printed-circuit board will be placed so as to fill free space between electronic components and units of another (or several other) sections of the printed circuit board. For clarity, the spatial volume of a component refers to the volume of space occupied by the component as determined by its geometric dimensions.

In some embodiments, one or more sections of the printed circuit board 1 include a connector configured to connect to a component of another section (e.g., after folding). For example, the connector of one section may be configured to connect to the connector of another section, a through-hole component, an electronic component, or any other component of another section (or even of another printed circuit board entirely, as evidenced by FIG. 4, which shows a connector 11 for an additional board, as well as an electronic functional unit board 13 with an associated electronic functional unit 12 coupled to the printed circuit board 1).

In some embodiments, the printed circuit board 1 includes an aluminum base. In some such embodiments, the aluminum base is particularly efficient at removing heat from the components within the folded assembly.

In some embodiments, one or more electronic components is encased in a flexible electrical insulation (e.g., having natural or polymeric filler to provide insulative properties).

In some embodiments, for improving heat-exchange characteristics, the package (e.g., the folded printed circuit board 1) is placed in an additional box and encased in a curable heat-conducting compound.

In some embodiments, the printed-circuit board 1 includes at least six sections 2, 3, 4, 5, 6, and 7 separated by bend lines 8. In some embodiments, surface-mount components 9 or through-hole components 10 are included on some or all of the sections (in some embodiments, sections 2, 3, and 4, although other section surfaces of the printed circuit board can also be used for accommodating components).

In some embodiments, after the components are installed (e.g., coupled to their respective sections), the printed circuit board 1 is bent along the bend lines 8 between the sections of the printed circuit board to form a polyhedron (or partial polyhedron). By way of non-limiting illustration, FIGS. 2-3 show an embodiment in which sections 2-7 take up the position of lateral and end polyhedral faces, and the electronic components 9 and 10 mounted on sections 2 and 4 of the board are brought to the cavities and placed in free space between the components of section 3 of the printed circuit board. In some embodiments, the fold-up sections 6 and 7 form the end faces and section 5 forms the top face. Such grouped structure makes it possible to significantly improve the compact layout of components while using a metal base that is effective in removing heat from the folded construct.

It should be noted again that, in some embodiments, the spatial structure faces are open as opposed to closed. An open design, as used in some embodiments, is suitable for creating channels that provide convective cooling air to an electronics package fabricated in accordance with the foregoing.

The described systems and methods may be embodied in other specific forms without departing from their spirit or essential characteristics. The described embodiments, examples, and illustrations are to be considered in all respects only as illustrative and not restrictive. The scope of the described systems and methods is, therefore, indicated by the appended claims rather than by the foregoing description. All changes that come within the meaning and range of equivalency of the claims are to be embraced within their scope. Moreover, any component and characteristic from any embodiments, examples, and illustrations set forth herein can be combined in any suitable manner with any other components or characteristics from one or more other embodiments, examples, and illustrations described herein.

What is claimed is:

1. An electronic module comprising:
   a printed circuit board comprising:
   a base formed of a metal material configured to operate as a heat sink, the base comprising a plurality of sections separated by bend lines, the base being further configured to fold at the bend lines to adopt a polyhedron configuration;
   a plurality of electronic components disposed on a first section of the base and defining a space between at least some of the plurality of electronic components; and
   an additional electronic component disposed on a second section of the base such that when the base is folded to adopt the polyhedron configuration, the additional electronic component becomes positioned at least partially within the space defined by the plurality of electronic components, wherein each of a first end and a second end of each of the bend lines terminates in a round relief configured to relieve plastic deformation of the base when the base is folded at the bend lines.

2. The electronic module of claim 1, wherein the plurality of electronic components comprises at least one of a surface-mount component and a through-hole component.

3. The electronic module of claim 1, wherein the metal material comprises aluminum.

4. The electronic module of claim 1, wherein the metal material consists of aluminum.

5. The electronic module of claim 1, wherein the polyhedron configuration comprises a closed polyhedron configured to shield the plurality of electronic components from radiation.

6. The electronic module of claim 5, wherein the base comprises six sections, and wherein the closed polyhedron comprises a rectangular prism with faces formed of the six sections.

7. The electronic module of claim 1, further comprising a connector configured to connect to a connecting component of the electronic module.

8. The electronic module of claim 7, wherein the connector is disposed on the first section of the base, and wherein the connecting component is disposed on the second section of the base.

9. The electronic module of claim 7, wherein the connecting component comprises an additional connector.

10. The electronic module of claim 7, wherein the connecting component comprises an electronic component.

11. The electronic module of claim 7, wherein the connecting component comprises a component of a second printed circuit board.

12. The electronic module of claim 1, wherein a third section of the base is free of electronic components.

13. The electronic module of claim 12, wherein a number of sections free of electronic components is greater than or equal to a number of sections with electronic components disposed thereon.

14. A method for providing an electronic module, the method comprising:

forming a substantially planar base for a printed circuit board from a metal material configured to operate as a heat sink;

forming a plurality of bend lines on the base, the bend lines dividing the base into a plurality of sections;

disposing a plurality of electronic components on a first section of the base such that the plurality of electronic components defines a space between at least some of the plurality of electronic components;

disposing an additional electronic component on a second section of the base;

disposing a connector on the base;

folding the base at each of the bend lines to cause the base to adopt a polyhedron configuration with each of the sections of the base forming a face of a polyhedron, whereupon folding the base, the additional electronic component disposed on the second section of the base becomes positioned at least partially within the space defined by the plurality of electronic components; and connecting the connector to a connecting component.

15. The method of claim 14, further comprising forming a round relief at a first end and at a second end of each of the bend lines, each round relief being configured to relieve plastic deformation of the base when the base is folded at the bend lines.

16. The method of claim 14, wherein the connecting component comprises an additional connector.

17. The method of claim 14, wherein the connecting component comprises an electronic component.

18. The method of claim 14, wherein the connecting component comprises a component of a second printed circuit board.

19. The method of claim 14, wherein the folding the base at each of the bend lines comprises folding the base using a device configured to bend metal.

20. An electronic module comprising:

a printed circuit board comprising:

a base having a configuration of a polyhedron, the base being divided into a plurality of sections, with each of the plurality of sections forming a face of the polyhedron;

an electronic component disposed on an interior surface of a first face of the polyhedron and positioned at least partially within a space defined by a plurality of additional electronic components disposed on an interior surface of a second face of the polyhedron, wherein a section of the base that is free of electronic components comprises a metal material configured to operate as a heat sink to help cool the electronic components disposed within the polyhedron.

* * * * *